United States Patent
Hasnine et al.

(10) Patent No.: US 12,512,375 B2
(45) Date of Patent: Dec. 30, 2025

(54) SYSTEM IN A PACKAGE (SIP) WITH AIR CAVITY

(71) Applicant: Qorvo US, Inc., Greensboro, NC (US)

(72) Inventors: Md Hasnine, Richardson, TX (US); Jeffrey Miller, Allen, TX (US); Yu Gary Gu, Colfax, NC (US); Neftali Salazar, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 355 days.

(21) Appl. No.: 17/819,203

(22) Filed: Aug. 11, 2022

(65) Prior Publication Data

US 2023/0145639 A1     May 11, 2023

Related U.S. Application Data

(60) Provisional application No. 63/363,831, filed on Apr. 29, 2022, provisional application No. 63/276,429, filed on Nov. 5, 2021.

(51) Int. Cl.
| | |
|---|---|
| *H01L 23/10* | (2006.01) |
| *H01L 23/06* | (2006.01) |
| *H01L 23/58* | (2006.01) |
| *H01L 25/18* | (2023.01) |

(52) U.S. Cl.
CPC .............. *H01L 23/10* (2013.01); *H01L 23/06* (2013.01); *H01L 23/585* (2013.01); *H01L 25/18* (2013.01)

(58) Field of Classification Search
None
See application file for complete search history.

(56) References Cited

U.S. PATENT DOCUMENTS

| | | | | |
|---|---|---|---|---|
| 7,144,756 | B1* | 12/2006 | Wang | H01L 23/055 |
| | | | | 257/E23.101 |
| 10,115,677 | B2* | 10/2018 | Lee | H01L 23/5226 |
| 11,749,631 | B2* | 9/2023 | Chen | H01L 23/053 |
| | | | | 257/737 |
| 2010/0200983 | A1* | 8/2010 | Ono | H01L 23/552 |
| | | | | 257/E23.181 |
| 2012/0126347 | A1 | 5/2012 | Yang et al. | |
| 2018/0240757 | A1* | 8/2018 | Wong | H01L 23/552 |
| 2018/0358298 | A1* | 12/2018 | Zhai | H01L 23/16 |
| 2020/0008327 | A1* | 1/2020 | Lear | H05K 9/0037 |
| 2020/0312782 | A1 | 10/2020 | Eid et al. | |

FOREIGN PATENT DOCUMENTS

WO     2018169893 A1     9/2018

OTHER PUBLICATIONS

Extended European Search Report for European Patent Application No. 22205106.2, mailed Jun. 29, 2023, 12 pages.

* cited by examiner

*Primary Examiner* — Brent A. Fairbanks
*Assistant Examiner* — Derek L Nielsen
(74) *Attorney, Agent, or Firm* — Withrow & Terranova, P.L.L.C.

(57) ABSTRACT

A system in package (SiP) with an air cavity is disclosed. In one aspect, a technique to bond a lid over the air cavity that reduces the risk of cavity integrity failure is provided. More specifically, a metal ring is provided that conforms to or is congruent to a shape of a lower lip of the lid. A dielectric material covers the metal ring, and a low modulus epoxy is used to bind the lower lip of the lid to the dielectric material. The lid and metal ring may have comparable thermal coefficients, which, when coupled with the low modulus epoxy, reduces chance of gross failure of the cavity.

13 Claims, 8 Drawing Sheets

SYSTEM IN A PACKAGE (SIP) WITH AIR CAVITY

PRIORITY CLAIM

The present application claims priority to U.S. Provisional Patent Application Ser. No. 63/363,831, filed on Apr. 29, 2022 and entitled "SYSTEM IN A PACKAGE (SIP) WITH AIR CAVITY," the contents of which is incorporated herein by reference in its entirety.

The present application also claims priority to U.S. Provisional Patent Application Ser. No. 63/276,429, filed on Nov. 5, 2021 and entitled "LEAK COMPLIANT AIR CAVITY SYSTEM IN A PACKAGE (SIP)," the contents of which is incorporated herein by reference in its entirety.

BACKGROUND

I. Field of the Disclosure

The technology of the disclosure relates generally to system in a package (SiP) assemblies that have air cavities.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been increased pressure to find ways to provide sufficient processing power in a single package. So-called system in a package (SiP) have evolved responsive to this pressure. However, SiP may be vulnerable to package failure and this leaves room for innovation in this space.

SUMMARY

Aspects disclosed in the detailed description include a system in a package (SiP) with an air cavity. In particular, a technique to bond a lid over the air cavity that reduces the risk of cavity integrity failure is provided. More specifically, a metal ring is provided that conforms to or is congruent to a shape of a lower lip of the lid. A dielectric material covers the metal ring, and a low modulus epoxy is used to bind the lower lip of the lid to the dielectric material. The lid and metal ring may have comparable thermal coefficients, which, when coupled with the low modulus epoxy, reduces the chance of gross failure of the cavity.

In this regard in one aspect, a SiP is disclosed. The SiP comprises a substrate comprising an upper surface. The SiP also comprises a metal ring positioned such that at least a portion extends above the upper surface, the metal ring having a ring contour. The SiP also comprises a lid having a lower lip surface having a lip contour substantially congruent to the ring contour. The SiP also comprises an epoxy attaching the lid to the metal ring.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a system in a package (SiP) with an air cavity. In particular, a technique to bond a lid over the air cavity that reduces the risk of cavity integrity failure is provided. More specifically, a metal ring is provided that conforms to or is congruent to a shape of a lower lip of the lid. A dielectric material covers the metal ring, and a low modulus epoxy is used to bind the lower lip of the lid to the dielectric material. The lid and metal ring may have comparable thermal coefficients, which, when coupled with the low modulus epoxy, reduces the chance of gross failure of the cavity.

Historically, multiple chips or integrated circuit (IC) dies may be placed on a single substrate and covered with a lid or overmold material, which is typically a plastic material. The lid is bonded to the substrate leaving an air cavity over the chips on the substrate. The lid may have a different thermal coefficient than the substrate and/or the material used to bond the lid to the substrate. The different thermal coefficients may cause the materials to expand and contract at different rates during thermal cycling. Such differences place stress on the bond and may result in failure at the bond. Such failures are undesirable and, when detected during manufacturing, require manual correction, which is slow and adds expense to the component. Accordingly, there is a desire to provide a better bond to prevent such gross package failures.

Exemplary aspects of the present disclosure provide a technique to provide a better bond between a lid and a substrate that reduces the overall stress on the bond during thermal cycling and reduces the likelihood of gross package failure. In particular, a top surface of a substrate has a metal ring whose contours and area are substantially congruent with the contour of the lower lip of the lid. A dielectric material may coat the metal ring to prevent oxidation and help match thermal coefficients with a low modulus epoxy and the plastic material of the lid. In some aspects, the low modulus epoxy may include a modulus of about 8 megapascals (MPa) or less, to promote flexibility of the bond between the lid and the substrate.

Figure 1A:
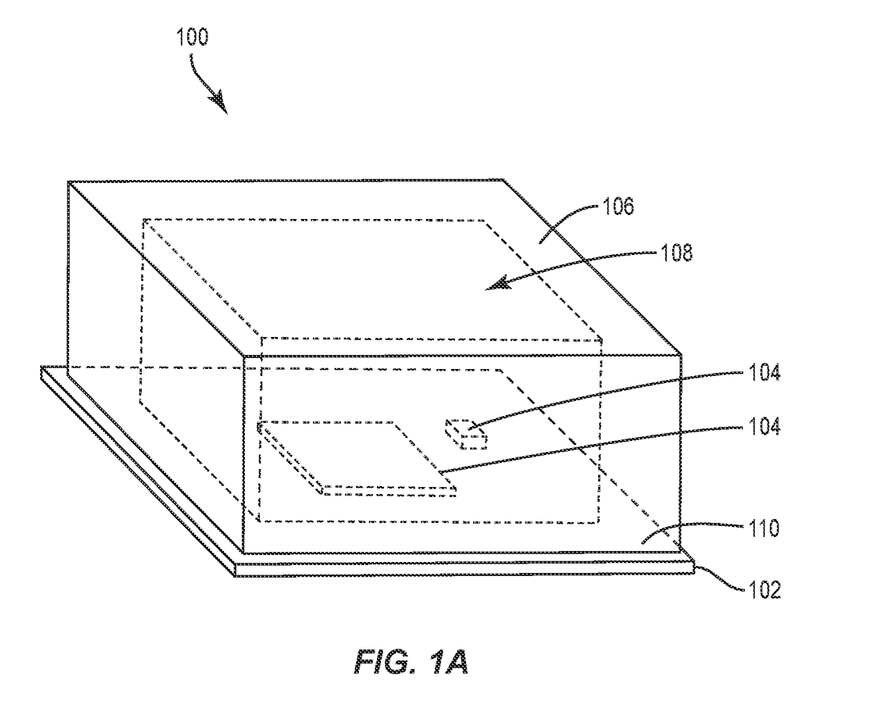
FIG. 1A is a perspective stylized side elevational view of a system in a package (SiP) according to an exemplary aspect of the present disclosure.

In this regard, FIG. 1A is side perspective view of a SiP 100 having a substrate 102 with chips and components 104 mounted thereon. The substrate 102 may be an FR4 material or the like and may include interior metal layers (not shown in FIG. 1 but explained in greater detail below). A lid 106 is securely attached or affixed to the substrate 102 to create an air cavity 108. More particularly, the lid 106 is affixed to a metal ring 110.

Figure 1B:
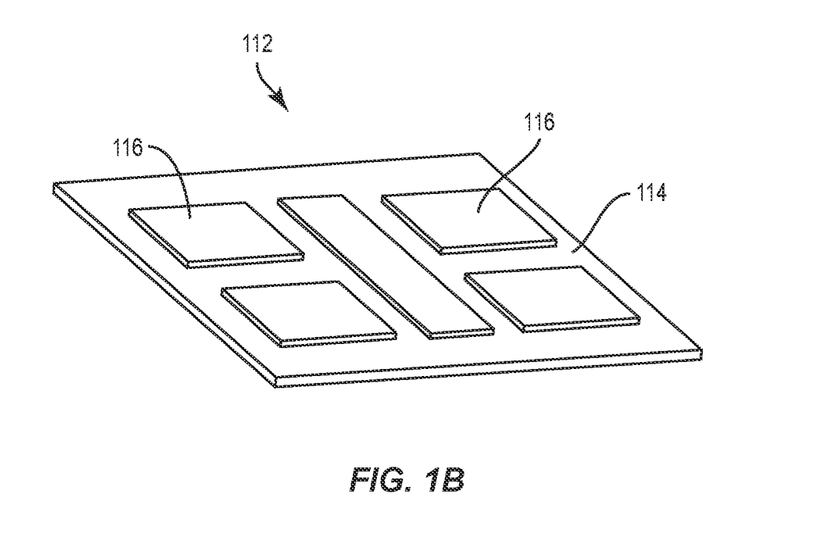
FIG. 1B is a perspective stylized side elevational view of a chiplet in a SiP according to an exemplary aspect of the present disclosure.

The chips and components 104 may include various die material(s) such as silicon (Si), gallium arsenide (GaAs), gallium nitride (GaN), silicon germanium (SiGe), indium phosphide (InP), or other material(s). In some aspects, the chips and components 104 may include one or more 'chiplets' 112 as better shown in FIG. 1B. A chiplet 112 may comprise a substrate interposer 114 interconnecting one or more die 116 thereupon. The substrate interposer 114 in some configurations may include semiconducting materials such as Si, silicon carbide (SiC), GaN, and GaAs. The substrate interposer 114 may also comprise a sandwiched network of interconnecting layer(s) deposed between low-k dielectric materials such as Ajinomoto Build-up Film (ABF), glass, or other suitable materials.

Figure 2:
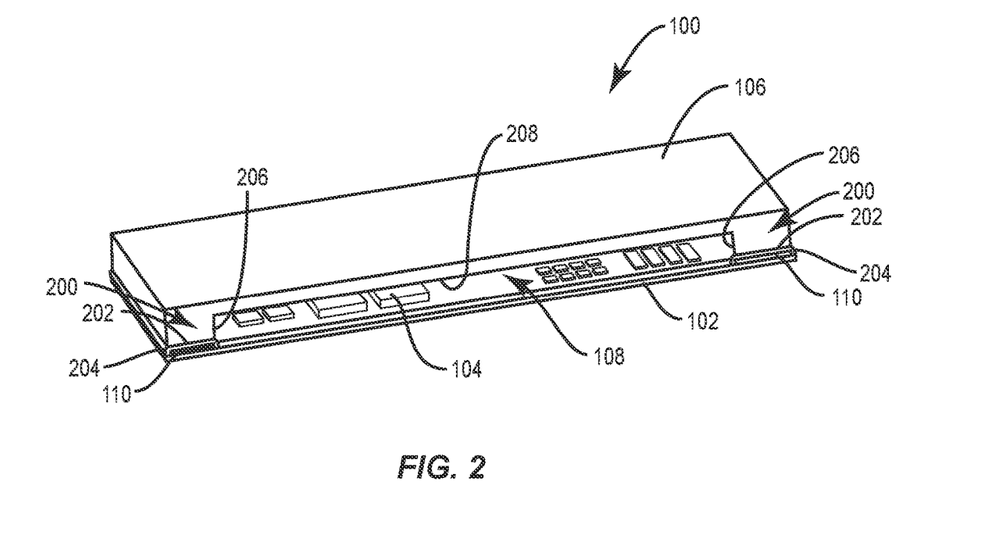
FIG. 2 is a perspective cross-sectional elevational view of the SiP of FIG. 1.

FIG. 2 provides a cross-sectional view of the SiP 100 and particularly illustrates the downwardly-directed lip portions 200 of the lid 106. The lip portions 200 have a lower surface 202. A low modulus epoxy 204 couples the lower surface 202 to the metal ring 110. More details on this coupling are provided with reference to FIGS. 4-7 below. As noted, in some aspects, the low modulus epoxy may include a modulus of about 8 MPa or less, to promote flexibility of the bond between the lid and the substrate.

Figure 3:
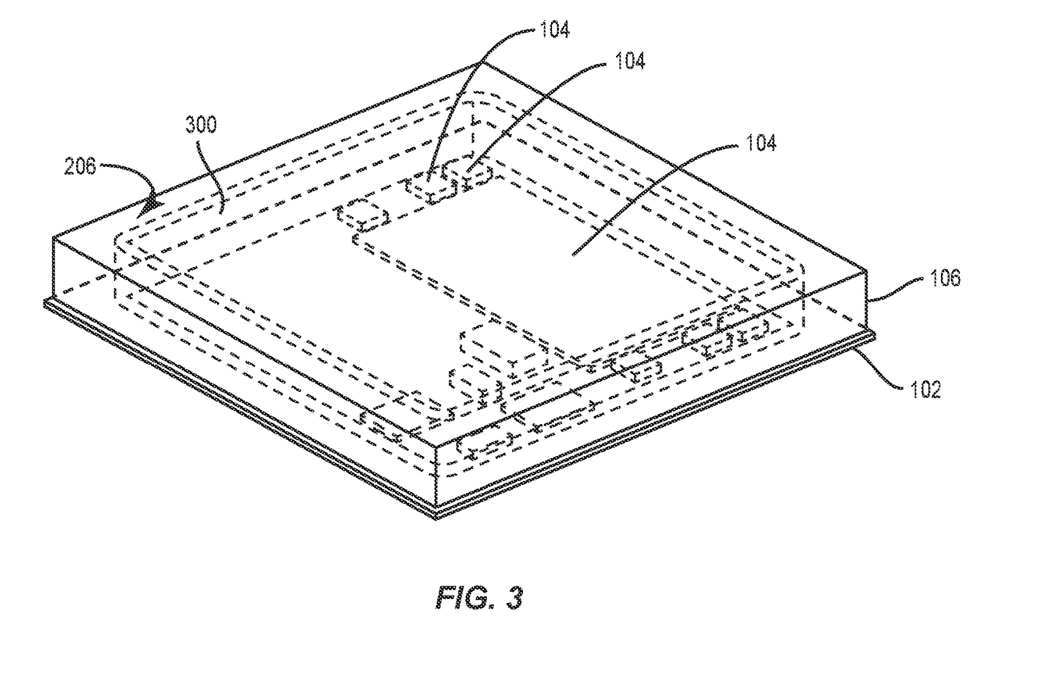
FIG. 3 is a perspective side elevational view of a SiP with a metal ring to assist in binding a lid to a substrate.

The lid 106 may be formed from a plastic material and thus may be subject to deformation. Accordingly, an interior wall 206 may be reinforced with an interior metal wall structure 300 as better seen in FIG. 3. The interior metal wall structure 300 may be sputtered on the interior wall 206 and optionally on a top interior surface 208 (better seen in FIG. 2). Alternatively, the interior metal wall structure 300 may be formed separately and adhered to the interior wall 206. The interior metal wall structure 300 may be conductive (e.g., aluminum (Al), copper (Cu), or silver (Ag) or more expensive metals such as gold (Au) or platinum (Pt)) and thereby also acts to reduce electromagnetic emissions to reduce electromagnetic interference (EMI) and support electromagnetic compatibility (EMC).

There are a variety of ways the lid 106 may be bonded to the substrate 102. Likewise, there are additional details for the substrate 102 that may help further support cavity integrity. At a minimum, the contours of the metal ring 110 (sometimes called ring contours) are substantially congruent with the contours of the lower surface 202 of the lip portions 200 (sometimes called lip contours).

As used herein, "congruent" means identical in form; coinciding exactly when superimposed. Further, as used herein, "substantially congruent" means no more than three percent by area of the lower surface is not matched to the metal ring. That is, having a ring that is larger than the lower surface is better than having a lower surface that is larger than the ring, but manufacturing tolerances may create relatively minor variations, and thus, the three percent tolerance where the lower surface may, in such instances, exceed the size of the ring.

Figure 4:
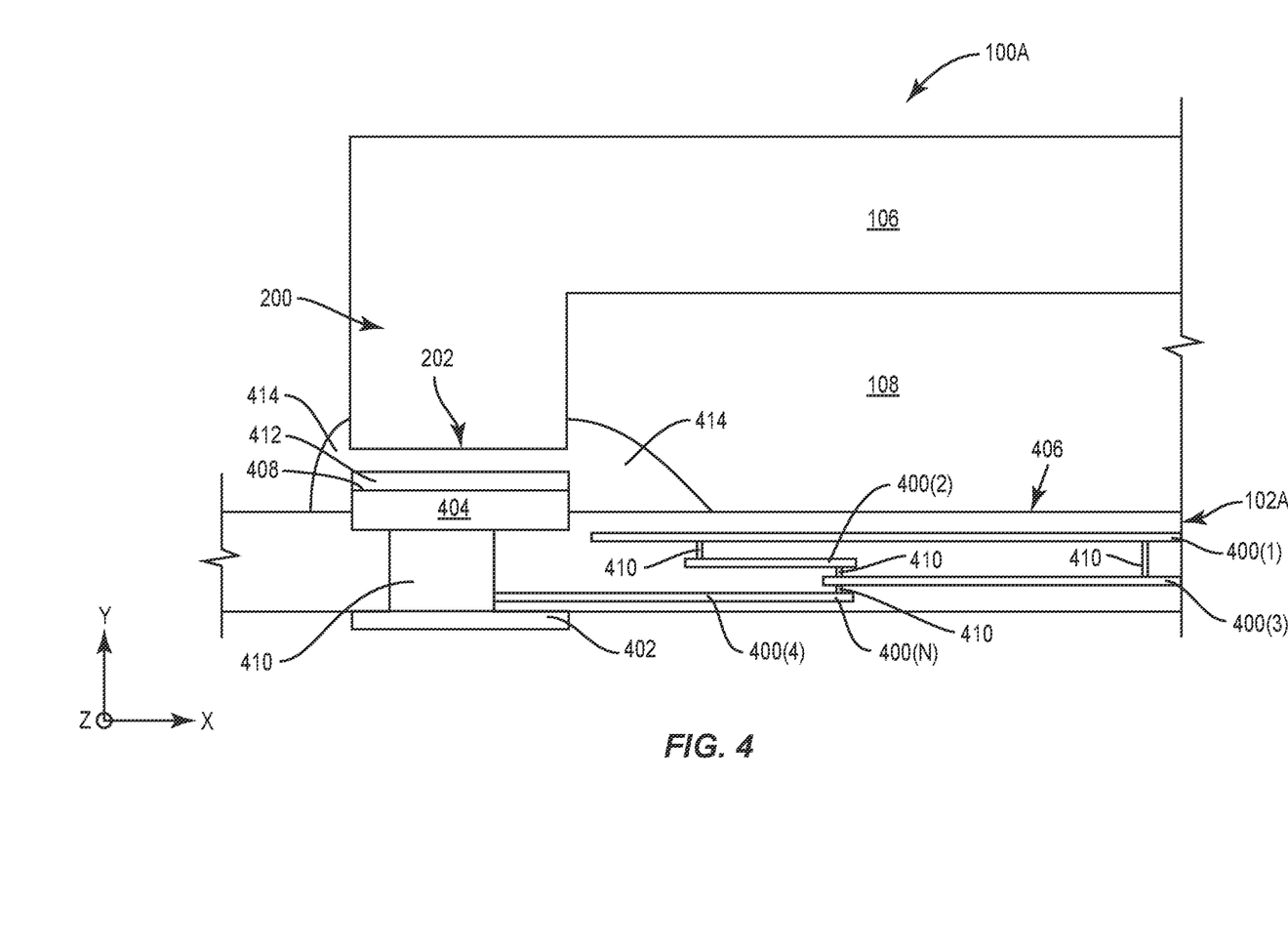
FIG. 4 is a first cross-sectional close-up view of a lid-to-substrate joint.

Turning now to FIGS. 4-7, a variety of bonding techniques are illustrated. In particular, FIG. 4 illustrates a SiP 100A that includes a substrate 102A. For the sake of clarity, top, bottom, above, below, upper, and lower as used herein are relative to the y-axis of the Figures and used to help the reader understand relative positions and not absolute requirements. The substrate 102A may have interior metal layers 400(1)-400(N), where, as illustrated, N=4. Additional metal layers 402 may be on a bottom side of the substrate 102A. A metal ring 404, analogous to the metal ring 110, is positioned either on a top surface 406 of the substrate 102A or partially embedded into the substrate 102A. In either case, at least an upper or top surface 408 of the metal ring 404 is above the top surface 406 of the substrate 102A. The metal ring 404 may be considered one of the metal layers of the substrate 102A. Vias 410 may interconnect the various metal layers 400(1)-400(N), 402, and 404. The various metal layers 400(1)-400(N), 402, and 404 may provide structural rigidity, act as interconnects, ground planes, or the like and no specific restriction is made as to their use. A dielectric material 412 is positioned on the top surface 408 of the metal ring 404 and the dielectric contours are substantially congruent thereto. The dielectric material 412 may assist in corrosion prevention for the metal ring 404 as well as help match thermal coefficients. In an exemplary aspect, the dielectric material 412 may be a solder mask. A low modulus epoxy 414 may be used to affix the lid 106 to the metal ring 404. As described above, the contour of the downwardly-directed lip portion 200 is also substantially congruent to the contours of the metal ring 404.

In general, any number of metal layers 400(1)-400(N) may be present, however, experimental data suggests that having six or more total metal layers (i.e., N≥ 4 or more plus additional metal layer(s) 402 and metal ring 404) provides better resistance to laminate failure and helps decrease the likelihood of gross failure that would allow the air cavity 108 to be compromised.

Figure 5:
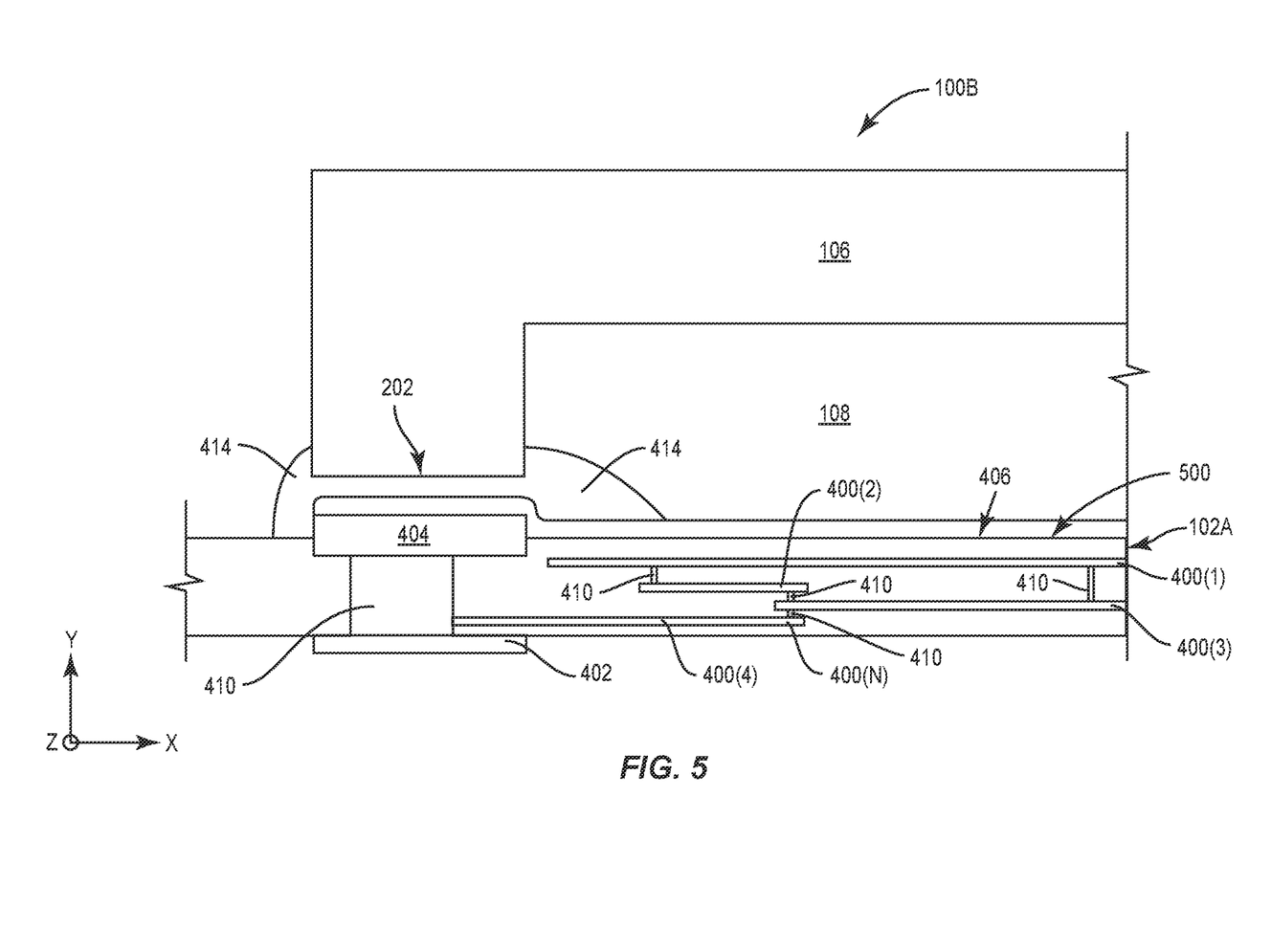
FIG. 5 is a second cross-sectional close-up view of a lid-to-substrate joint.

FIG. 5 illustrates a similar SiP 100B that has one variation relative to the SiP 100A. Specifically, the dielectric material 412 has been replaced with a dielectric layer 500 that covers not just the metal ring 404, but also some portion of the top surface 406 of the substrate 102A. This approach may be easier from a manufacturing perspective as not needing a specific mask to be used during application of the dielectric layer 500.

Figure 6:
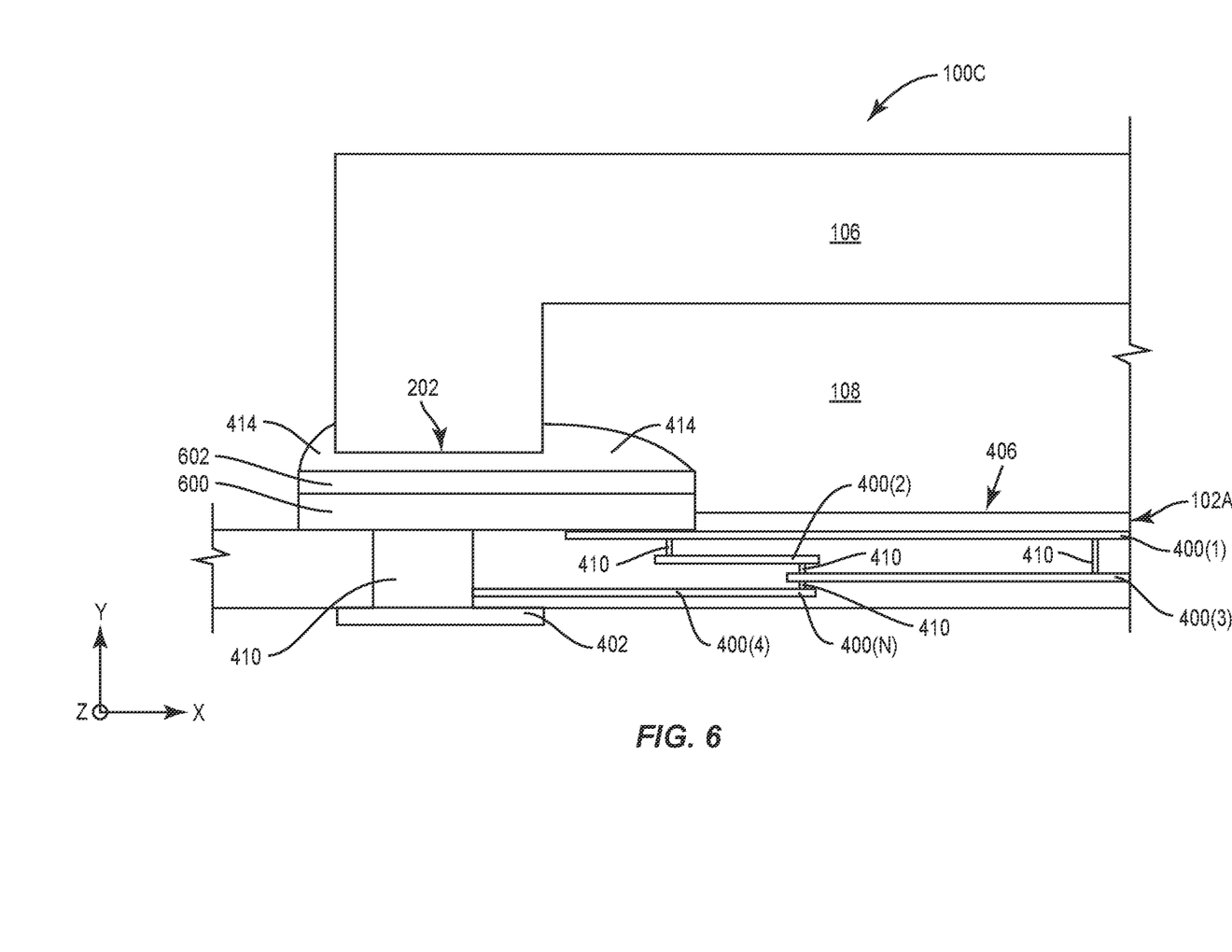
FIG. 6 is a third cross-sectional close-up view of a lid-to-substrate joint.

FIG. 6 illustrates another variation in SiP 100C that has an expanded metal ring 600 and correspondingly larger dielectric material 602. Thus, as noted above, it is within the scope of the present disclosure for the contour of the metal ring 600 to be larger than the contour of the lower surface 202 of the lip portion 200 of the lid 106.

Figure 7:
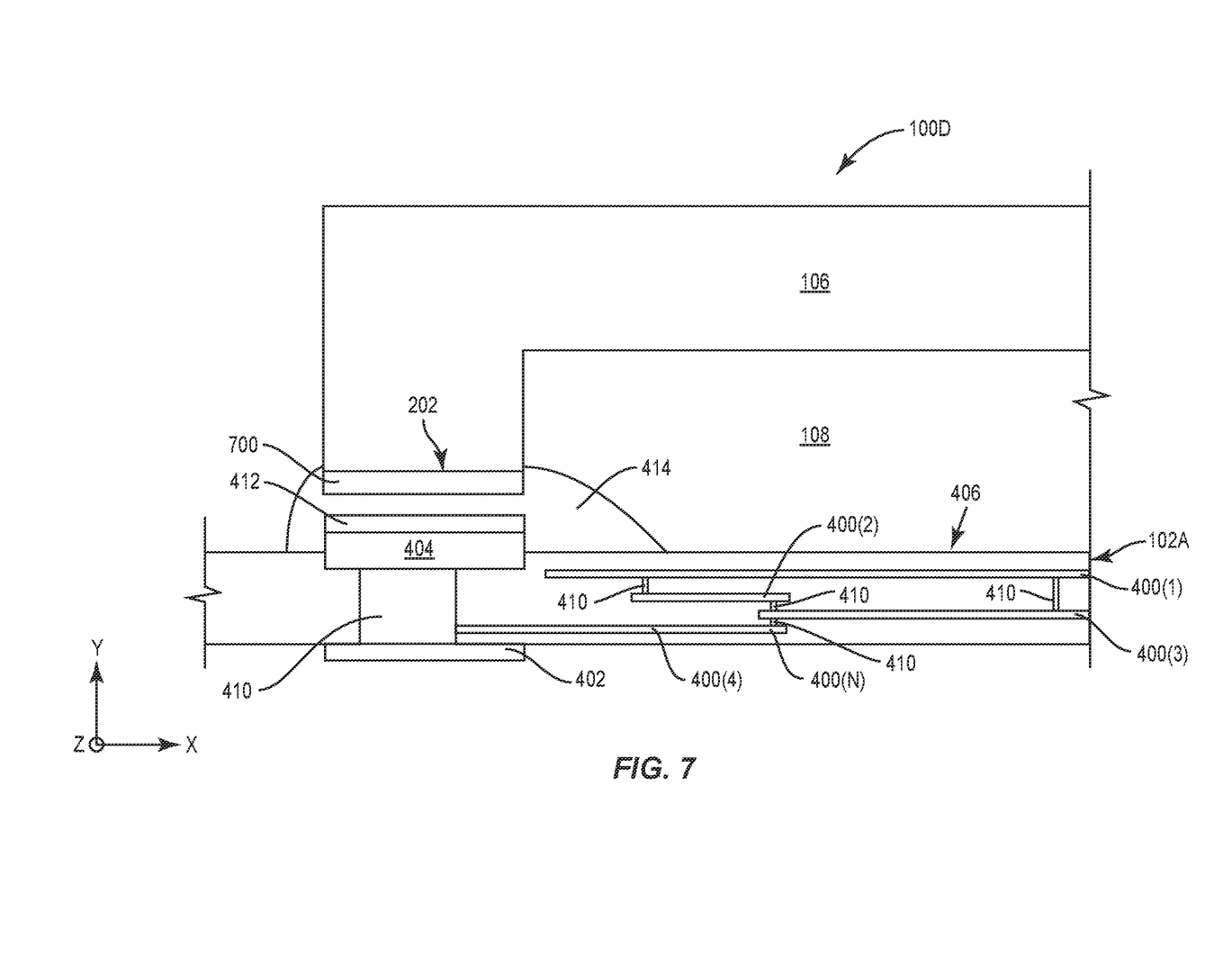
FIG. 7 is a fourth cross-sectional close-up view of a lid-to-substrate joint.

FIG. 7 illustrates another variation in SiP 100D that adds an additional dielectric material 700 to the lower surface 202 of the lip portion 200. This may assist in providing better matching of thermal coefficients.

In general, to assist in prevention of delamination or failure of the bond between the lid 106 and the substrate 102, 102A, the thermal coefficients of the dielectric material 412, 500, 602, 700, the epoxy 414, and the lid 106 should be close. The modulus of the epoxy 414 will, in part dictate how close the thermal coefficients should be. Low modulus epoxies will have low deflections, low bending stresses, and high radii of curvature to generate lower overall vertical (y-axis) deformation. The general equations for this are set forth in equations 1 and 2 below.

$$\sigma = E^* \Delta \alpha^* \Delta T \quad (1)$$

$$S_b = Eh/2\gamma R \quad (2)$$

Where $S_b$ is the bending stress and $\sigma$ is the thermal stress and both are directly proportional to the modulus E of the epoxy 414. $S_b$ is also proportional to the temperature change (T) and coefficient of thermal expansion ($\alpha$). $\sigma$ is also proportional to the height (h), inversely proportional to the radius of curvature (R) and Poisson ratio ($\gamma$).

Figure 8:
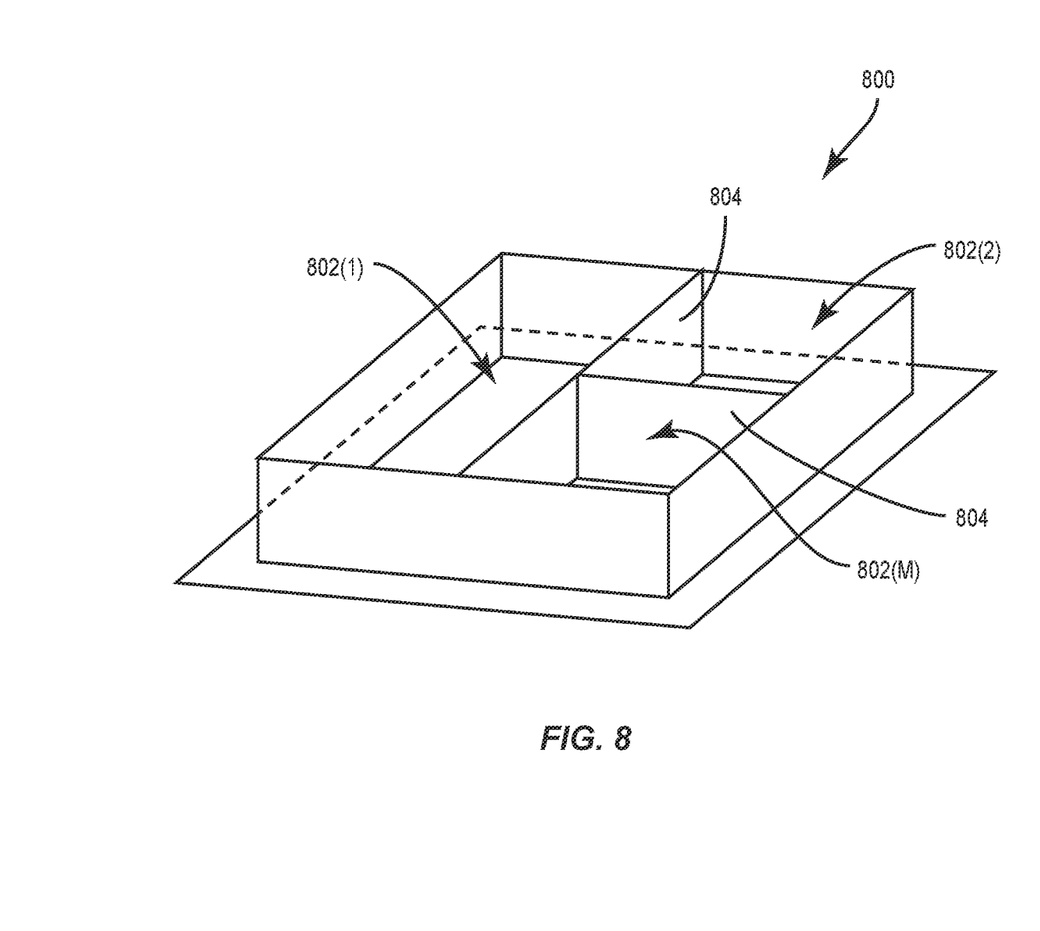
FIG. 8 is a perspective view of a lid with interior compartments.

Note that while the above discussion has shown the lid 106 as being generally rectilinear with a single air cavity 108, the present disclosure is not so limited. Thus, as illustrated by lid 800 in FIG. 8, there may be multiple air cavities 802(1)-802(M) formed by interior walls 804.

Figure 9A:
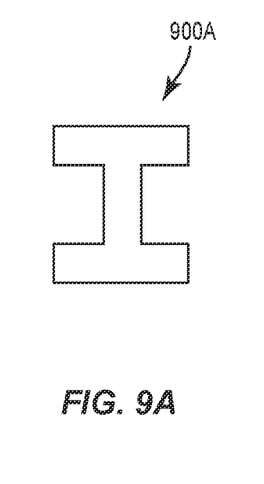
FIGS. 9A-9C show alternate lid shapes.
Figure 9B:
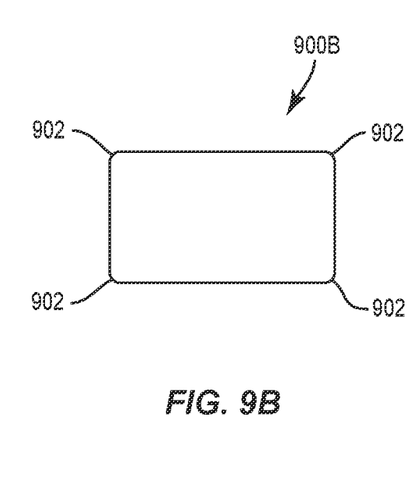
Figure 9C:
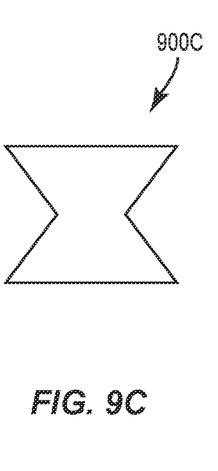

Likewise, lids 900A-900C, illustrated in FIGS. 9A-9C may be non-rectilinear shapes, with lid 900A looking like a capital I, lid 900B having rounded corners 902, and lid 900C looking like an hourglass. Other shapes are likewise still within the scope of the present disclosure, with asymmetrical, arcuate, rounded, or other shapes all capable of being used.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A system in a package (SiP) comprising:
    a substrate comprising an upper surface;
    a metal ring positioned such that at least a portion extends above the upper surface, the metal ring having a ring contour;
    a first dielectric material positioned on the metal ring, wherein the first dielectric material has a dielectric contour substantially congruent to the ring contour so as to assist in corrosion resistance of the metal ring;
    a lid having a lower lip surface having a lip contour substantially congruent to the ring contour, wherein the lid delimits an air cavity above the substrate when the lid is attached;
    a second dielectric material positioned on a lower surface of the lower lip surface; and
    an epoxy attaching the lid to the metal ring, wherein the lid, the epoxy, the first dielectric material, and the second dielectric material have approximately equal thermal coefficients.

2. The SiP of claim 1, wherein the first dielectric material covers an upper surface of the metal ring and at least part of the upper surface of the substrate.

3. The SiP of claim 1, wherein the epoxy comprises a low modulus epoxy.

4. The SiP of claim 1, further comprising an interior metal wall positioned within the lid.

5. The SiP of claim 1, further comprising an interior metal layer sputtered on an interior surface of the lid.

6. The SiP of claim 1, further comprising one or more chips positioned on the substrate.

7. The SiP of claim 1, wherein the substrate comprises a plurality of interior metal layers.

8. The SiP of claim 7, wherein the plurality of interior metal layers comprises more than three interior metal layers.

9. The SiP of claim 1, further comprising a plurality of chiplets positioned on the substrate.

10. The SiP of claim 9, wherein each of the plurality of chiplets comprises a substrate interposer, wherein the substrate interposer comprises one or one or more low-k dielectric layers interposed by one or more metal layers, the metal layers interconnecting one or more die within a chiplet.

11. The SiP of claim 9, wherein each of the plurality of chiplets comprises a substrate interposer, wherein the substrate interposer comprises one or one or more low-k dielectric layers interposed by one or more metal layers disposed upon a semiconducting material, the metal layers interconnecting one or more die within a chiplet.

12. The SiP of claim 1, wherein the lid comprises a plastic material.

13. The SiP of claim 1, wherein an area within the ring contour has a greater area than an area inside the lip contour.

* * * * *